United States Patent
van Kessel et al.

[11] Patent Number: 6,149,498
[45] Date of Patent: Nov. 21, 2000

[54] SEMICONDUCTOR WAFER HANDLING SYSTEM

[75] Inventors: Theodore G. van Kessel, Millbrook, N.Y.; Chris R. Whitaker, Williston, Vt.

[73] Assignee: International Business Machines Corporation, Armonk, N.Y.

[21] Appl. No.: 09/464,166

[22] Filed: Dec. 16, 1999

Related U.S. Application Data

[62] Division of application No. 09/059,070, Apr. 13, 1998.

[51] Int. Cl.$^7$ ...................................................... B24B 7/00
[52] U.S. Cl. ........................... 451/28; 451/331; 451/339; 451/333
[58] Field of Search .................................. 451/285, 331, 451/336, 337, 339, 28

[56] References Cited

U.S. PATENT DOCUMENTS

| | | |
|---|---|---|
| 951,754 | 3/1910 | Buzzell et al. . |
| 1,684,370 | 9/1928 | Schuster . |
| 2,819,122 | 1/1958 | Scheider . |
| 3,115,369 | 12/1963 | Bozich . |
| 3,490,812 | 1/1970 | Uchida . |
| 4,348,139 | 9/1982 | Hassan et al. . |
| 4,971,481 | 11/1990 | Foreman . |
| 4,990,047 | 2/1991 | Wagner et al. . |
| 5,213,451 | 5/1993 | Frank et al. ................. 406/72 |
| 5,226,758 | 7/1993 | Tanaka et al. . |
| 5,478,195 | 12/1995 | Usami . |
| 5,628,828 | 5/1997 | Kawamura et al. . |
| 5,634,636 | 6/1997 | Jackson et al. . |
| 5,733,171 | 3/1998 | Allen et al. ................. 451/41 |
| 5,797,789 | 8/1998 | Tanaka et al. ............... 451/41 |
| 5,827,110 | 10/1998 | Yajima et al. ............... 451/288 |
| 5,830,045 | 11/1998 | Togawa et al. .............. 451/288 |
| 5,893,795 | 4/1999 | Perlov et al. ............... 451/288 |
| 5,906,532 | 5/1999 | Nakajima et al. ........... 451/285 |
| 5,908,347 | 6/1999 | Nakajima et al. ........... 451/285 |
| 5,975,986 | 11/1999 | Allen et al. ................. 451/288 |
| 6,007,411 | 12/1999 | Feeney ...................... 451/41 |

Primary Examiner—David A. Scherbel
Assistant Examiner—Lee Wilson
Attorney, Agent, or Firm—Ratner & Prestia; Howard J. Walter, Jr.

[57] ABSTRACT

A unidirectional gate disposed between interconnecting fluid transport regions in a manufacturing process. The gate allows workpieces to pass from a first transport region to a second transport region but prevents them from returning to the first region after having passed into the second region. The gate may specifically be used in semiconductor wafer manufacturing, especially where wafers exit a water track into a cassette.

14 Claims, 3 Drawing Sheets

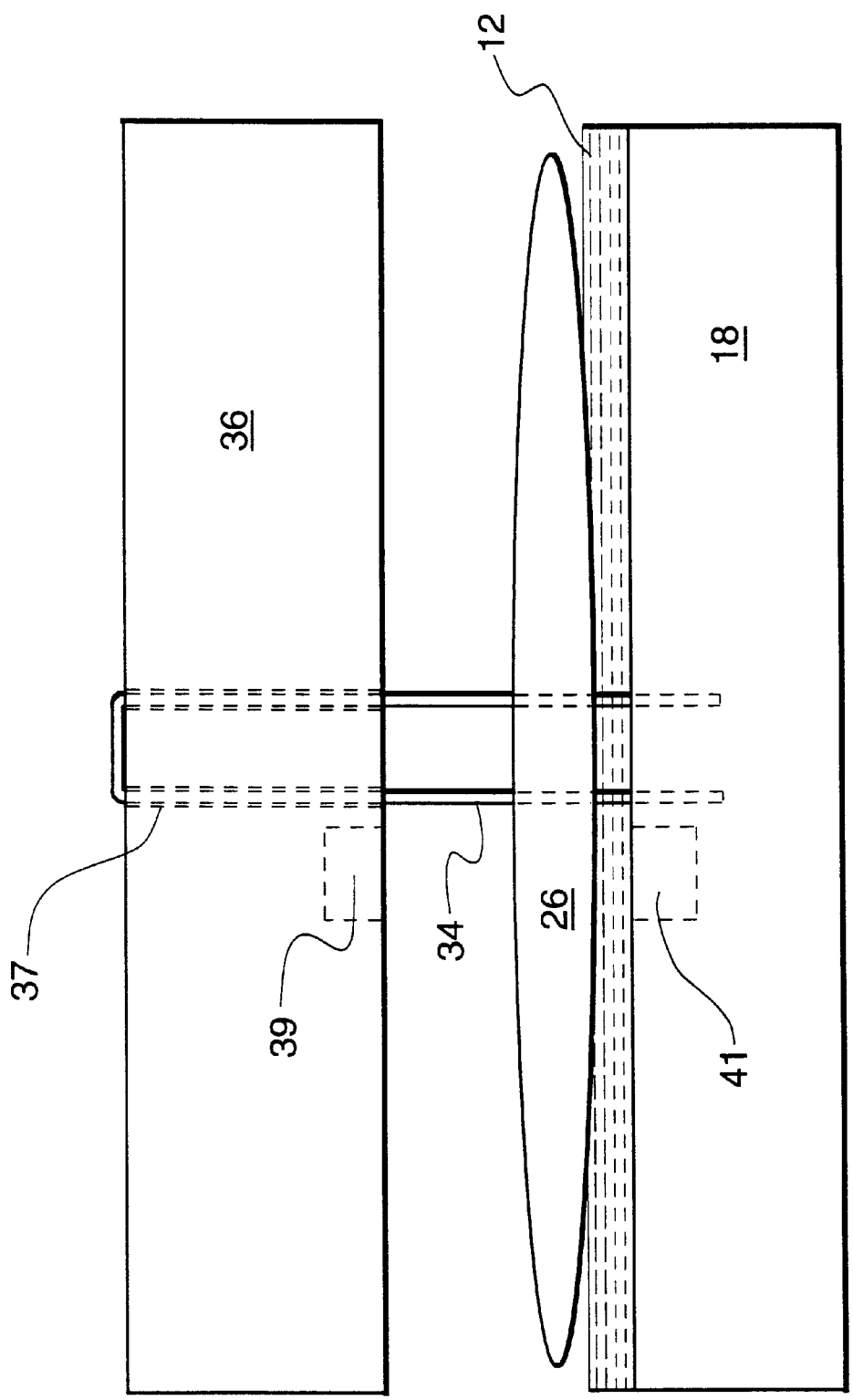

SEMICONDUCTOR WAFER HANDLING SYSTEM

This application is a division of U.S. patent application Ser. No. 09/059,070, filed on Apr. 13, 1998, which has allowed.

TECHNICAL FIELD

This invention relates to a unidirectional gate between interconnecting regions of a fluid transport system used in manufacturing and, more particularly, to a unidirectional gate between interconnecting regions of a fluid transport system used in semiconductor wafer manufacturing.

BACKGROUND OF THE INVENTION

Fluid transport systems use a liquid or a gas, usually water or air, as a carrier to move objects contained within the fluid. Such systems are often used in a manufacturing environment to transport bulk product or individual workpieces through the manufacturing line. Specifically, in the manufacture of silicon wafers, a water transport system moves silicon wafers through sections of the manufacturing line on a water track where jets of water propel the wafers to the desired destination. Other water tracks may be designed to carry wafers along a gently sloping flume much like leaves on a stream.

Occasionally, due to turbulence, eddies, or some other discontinuity in the water flow, there may be a section of the fluid transport system where a wafer may reverse direction from time to time. Such reversal may create jams in the manufacturing line, cause damage to the product, or both.

During the processing of silicon wafers in the manufacture of integrated circuit chips, a chemical mechanical polishing (CMP) step is often required to planarize the wafer surface before depositing successive chip layers. This step is required because the chip surface is often uneven following an etch or deposition step, whereas an even surface is preferred for deposition of the next layer. Therefore, a dielectric coating is applied to the chip, and the dielectric coating is then polished to a perfectly planar surface prior to deposition of the next layer.

Polishing occurs in a polisher, where a wafer is held on a wafer holder plate, by suction, and is rotated. A polishing cloth is pressed with a predetermined force onto the wafer, and a stream of abrasive slurry is sprayed on the wafer. The surface of the wafer is thus polished with the polishing cloth and the abrasive slurry until the surface reaches the desired gloss. Because the abrasive slurry leaves a residue on the wafer, a water track is a desirable way to transport the wafer without having to handle the wafer in a way that risks the abrasive slurry residue causing unintentional damage. It is important, therefore, to keep the wafer wet during its transport and to avoid any extra handling which might unintentionally grind the abrasive slurry against the surface of the wafer.

Thus, a water track is often provided to transfer polished wafers partially covered with abrasive slurry residue from the polisher into an unload cassette. The unload cassette is located in a water reservoir filled with water to the same level as the water track. The unload cassette typically has a plurality of empty slots for receiving wafers, and it indexes automatically after filling a slot with a wafer, thus positioning a new empty slot to receive a new wafer. When the cassette is filled with wafers, an alarm alerts an operator to activate the indexing mechanism to index the cassette into a removal position. The operator then removes the cassette and takes it to a cleaning operation where the abrasive slurry is completely cleaned from each wafer.

Specifically, in the wafer polishing section of a wafer manufacturing line, wafers leave the polisher on a water track that carries them to the unload cassette. The unload cassette slot receives the wafer immediately as it leaves the water track. Occasionally, however, a wafer reverses direction out of the cassette and partially back into the water track. When the unload cassette indexes, it then shatters the wafer caught between the cassette and the edge of the water track.

It is thus necessary to provide some way to prevent a wafer from reversing direction once it leaves the water track, so that it does not suffer damage when the unload cassette indexes. Other manufacturing processes having fluid transport systems may have similar needs for prevention of damage to the products or just to keep products flowing in the desired direction along the fluid transport system.

Various mechanisms for changing direction of wafers in a fluid transport system or for otherwise actively moving wafers from one part of a fluid transport system to another are known. Specifically, various systems for transporting wafers between the polisher and the unload cassette are known. U.S. Pat. No. 5,226,758, issued to Kohichi Tanaka et al. and assigned to Shin-Etsu Handotai Co., Ltd., Japan, discloses and claims a semiconductor wafer handling apparatus and method for transferring a wafer from a wafer holder to a wafer cassette submerged in water. Essentially, Tanaka et al. address the same operation of moving wafers from the polisher to the unload cassette as is involved in the present invention. Tanaka et al. claim an apparatus, however, that receives each wafer at the end of the water track and swings 180° to flip each wafer upside down and drop it into the water reservoir containing the cassette. The wafer then sinks and is forced into the receiving slot of the cassette by an unclaimed mechanism, such as a forced water stream.

The process of flipping each wafer entails extra mechanical handling and motion, such extra handling always having associated with it some risk of mechanical failure or mishandling. Such extra handling is not necessary in a fluid transport system having a water track at the same water level as the reservoir, where the wafer can proceed directly from the polisher along the water track and into the unload cassette without any reorientation. Such a system has the disadvantage, however, that a wafer may occasionally drift back out of the unload cassette, thus exposing it to damage when the unload cassette indexes.

There remains a need, therefore, for a solution to the problems identified above. To overcome the shortcomings of the conventional devices, a new unidirectional gate between interconnecting regions of a fluid transport system is provided. An object of the present invention is to provide a flexible, inexpensive gate that enables passage of the wafer into the unload cassette, but keeps the wafer from reversing direction back into the water track. Such a gate would be applicable to any fluid transport system having a similar interface.

SUMMARY OF THE INVENTION

To meet this and other needs, and in view of its purposes, the present invention provides a unidirectional gate between interconnecting regions of a fluid transport system used in manufacturing, preferably semiconductor wafer manufacturing, wherein the unit being transported, preferably a semiconductor wafer, can pass in the desired direction through the gate, but is prevented from reversing direction.

Specifically, in a fluid transport system for workpiece handling, the present invention comprises a unidirectional gate between interconnecting regions of the fluid transport system. The unidirectional gate has a first fluid transport region for transporting workpieces in a first direction, a second fluid transport region that receives workpieces transported by the first region, and a flexible gate located between the first and second regions. The flexible gate has one end fixed and the other end disposed in the path of workpiece transport without disrupting fluid transport, such that the gate allows workpieces to pass from the first region to the second region but prevents workpieces from returning to the first region after having passed into the second region.

Preferably, the present invention is directed to a semiconductor manufacturing line where the workpieces are semiconductor wafers, where the fluid in the fluid transport system is water, and where the interconnecting regions in the manufacturing line are a water track and a cassette, specifically the water track exiting the wafer polisher and the unload cassette.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 2 shows a view from inside the water track looking out through the gate that is the subject of the present invention.

DETAILED DESCRIPTION OF THE INVENTION

Figure 1A:
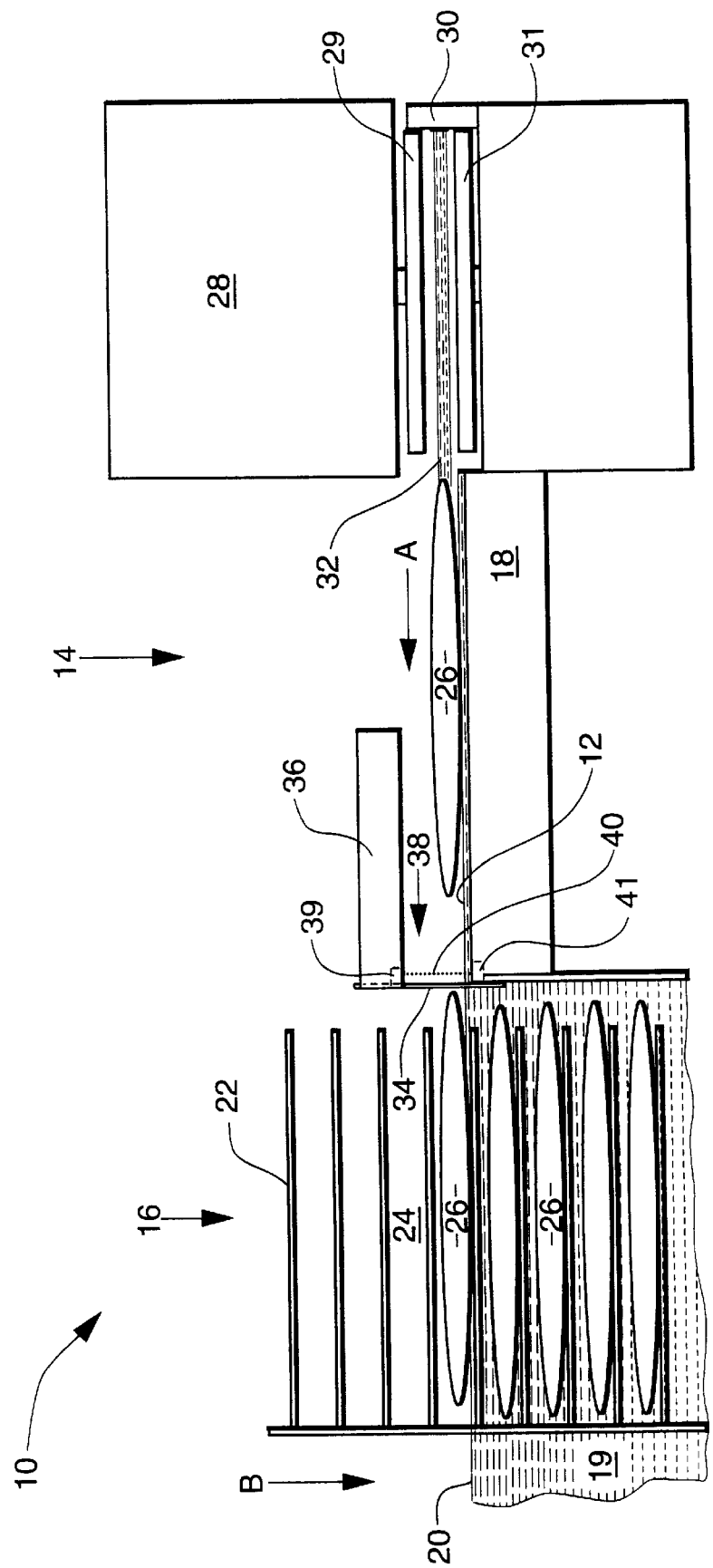
FIG. 1A shows a typical embodiment of the present invention in a wafer manufacturing line with the gate closed in its relaxed position.
Figure 1B:
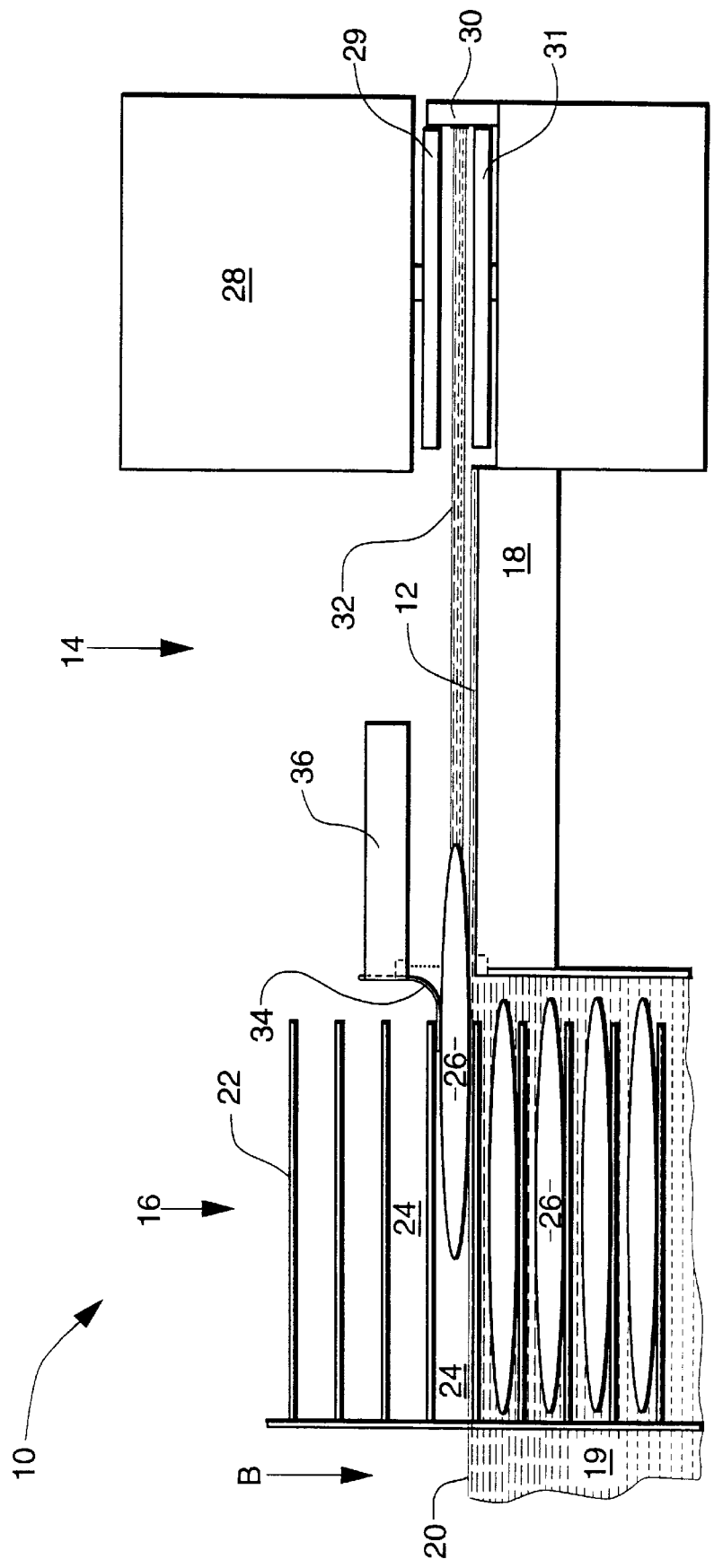
FIG. 1B shows a typical embodiment of the present invention in a wafer manufacturing line with the gate open during passage of a wafer.

Referring now to the drawing, wherein like reference numerals refer to like elements throughout, FIGS. 1A and 1B show a section of a manufacturing line 10 having a fluid transport system using fluid 12 (water) and having two regions of interest with regard to the present invention: a first region (water track region 14) and a second region (unload cassette region 16). The water track region 14 has within it a water track 18, upon which the water 12 flows toward the unload cassette region 16 in the direction of arrow A. Unload cassette region 16 has within it a reservoir 19 of water having a water level 20 at substantially the same level as the water exiting water track 18, and an unload cassette 22 having a plurality of slots 24 within which to receive a plurality of wafers 26.

In the polisher 28, wafer 26 is held on a wafer holder plate 29 by suction, and is rotated while it is polished by a polishing cloth 31 in cooperation with a stream of abrasive slurry (not shown) sprayed on the wafer.

The surface of wafer 26 is thus polished until the surface reaches the desired gloss. Upon completion of the polishing step, the suction holding the wafer in place is released, and nozzle 30 shoots a water jet 32 at the edge of wafer 26 with enough force to break any remaining attraction between the wafer and the wafer holder. After loosening the wafer, the water jet 32 then propels the wafer along water track 18. A set of several water jets from several nozzles may also be used. The amount and strength of the water jet or jets must be balanced so that they are enough to break any residual attraction between the wafer and wafer holder, but not so much that excessive backflow and eddies are created at the water track exit. Excessive backflow or eddies may disrupt movement of the wafer along the track.

Each wafer 26 flows along water track 18 in the direction of arrow A, exits the water track through gate 34, and enters a slot 24 in unload cassette 22. As it exits the track, wafer 26 passes through sensor 38, which may be, as shown, a photosensor comprising a photoemitter 39 emitting a light beam 40 that is sensed by a photoreceiver 41. Such a photosensor detects that wafer 26 has exited water track 18 whenever light beam 40 returns to photoreceiver 41 after having been broken by wafer 26. Other types of sensors may be used, however, to detect that wafer 26 has left the water track.

Once the sensor indicates that the wafer has left the water track, the unload cassette is indexed downward along arrow B to align another slot with the exit of water track 18. In the absence of the gate of the present invention, a wafer 26 moving through photosensor 38 may move completely through light beam 40, thus triggering indexing, only to float slightly backward between the time photosensor 38 registers the passage of the wafer and the time unload cassette 22 actually indexes. If the wafer moves backward far enough to have an edge above the water track, the indexing will catch the wafer between the edges of the cassette slot an the edge of the wafer track, thus creating shear forces that will break the brittle wafer.

Thus, generally, in a manufacturing line having a fluid transport system for handling workpieces such as wafers in the present system, a unidirectional gate is provided between interconnecting regions of the fluid transport system. The gate prevents the workpieces, in this case wafers, from reversing direction, where such reversal could cause product damage, a jam in the transport system, or both. Such a gate must be disposed in the path of the workpieces and be flexible enough to allow the workpieces to pass in the desired direction, yet firmly prevent workpieces from passing in the reverse direction. The gate must also not disrupt the fluid transport, or else the workpiece transport might be disrupted also.

Thus, in the specific case of wafer 26 on water track 18, gate 34 is fixed at one end to bridge 36 above water track 18, and flexibly disposed across the exit of the water track in the path of wafer 26 to prevent the wafer from floating backward. As a wafer moves through gate 34, the gate flexes to allow passage of the wafer as shown in FIG. 1B. Once the wafer has passed through gate 34, however, the wafer cannot return to the water track because gate 34 impedes its motion as shown in FIG. 1A.

Gate 34 is shown in FIG. 1A and 1B as fixed above the water track on bridge 36, but gate 34 could also be fixed below or to one side of water track 18, as long as its flexible end allows wafers to exit but not return to the water track, and as long as the positioning of gate 34 does not materially disrupt the flow of the fluid on the water track into the unload cassette. A gate that disrupted the water flow could create backflow or eddies itself, thus impeding the movement of the wafer along the track.

As shown, gate 34 is prevented from flexing backward because its lower portion catches against the edge of water track 18. Other methods may be used, however, to position gate 34 relative to water track 18 so that gate 34 only flexes in the preferred direction.

Gate 34 typically is constructed of a length of monofilament line or lightweight tubing, but any material sufficiently flexible and non-abrasive is acceptable, as long as the gate is shaped so that the fluid flow is not materially disrupted, and thus the fluid transport is not disrupted.

Referring specifically to FIG. 1B, there is shown a wafer 26 in transit through gate 34, thus showing the problem gate 34 solves. Without gate 34, after wafer 26 exits water track 18 and triggers photosensor 38, it could drift backward into the position shown in FIG. 1B. As cassette 22 would index downward, wafer 26 would be trapped between water track 18 and cassette 22, thereby breaking into pieces under the stress of the opposing shear forces.

In a preferred embodiment of the present invention, the proximity of unload cassette 22 to the water track exit as well as the type of interface between the unload cassette and the water track creates the need for gate 34 of the present invention. In this embodiment, the interface between the water track and the unload cassette comprises the same water level in both regions of the fluid transport system. In such a system, each wafer exits the water track and moves along the water surface directly into place in the unload cassette. The interface in this embodiment is different than the interface of the '758 patent issued to Tanaka et al., where the water level in the unload cassette region is lower than the water level in the water track.

The interface of this embodiment is also different from an interface of the prior art, disclosed by Tanaka et al., in which the unload cassette is not submerged in water, but rather the wafer and the water exit the water track directly onto the unload cassette. In that system, the wafer is retained on the unload cassette while the water falls away, and the wafer can be damaged as it drops abruptly onto the surface of the cassette.

The fluid transport system interface of the embodiment having a constant water level in both the water track and unload cassette offers several advantages. Such an interface avoids rough handling of the wafer, as in the interface where the water falls away. Such an interface also avoids the extra mechanical handling of the Tanaka et al. device which must flip the wafer. Without the gate of the present invention, however, the constant water level interface would create the disadvantage of a wafer occasionally reversing direction and drifting out of the unload cassette.

Wafer 26 is approximately 20 cm (8 inches) in diameter, and travels a distance of approximately 38–46 cm (15–18 inches) on water track 18 between polisher 28 and unload cassette 22 in a preferred embodiment. The distance between the edge of water track 18 and unload cassette 22 is approximately 0.6 to 1.3 cm (0.25 to 0.5 inches), so that wafer 26 cannot tilt downward as it leaves water track 18 and thus potentially miss its intended slot 24 in unload cassette 22. Thus, given the close proximity of unload cassette 22 to the water track 18 exit, even reversing direction for a small distance due to backflow would risk damage to wafer 26. Therefore, gate 34 of the present invention is required.

Typically, twenty to twenty-five pound test standard monofilament fishing line having a diameter of around 0.05 mm (0.002 inches) is preferred for constructing gate 34. Rubber or synthetic elastomer tubing may also be used. In a preferred embodiment, a plastic or polymer construction is preferred to prevent contamination of the water used in the fluid handling system, but other materials of construction may be more ideally suited for use with different carrier fluids. Other sizes and materials for gate 34 may optimally be flexible enough to allow passage of wafers in the preferred direction, but stiff enough to prevent passage in the reverse direction.

Referring next to FIG. 2, there is shown a view from inside water track 18 looking out through gate 34. This view shows gate 34 positioned relative to the water track 18. Gate 34 may consist of a single strand of monofilament line or tubing, or may consist of multiple strands. Gate 34 as shown in FIG. 2 consists of two lengths of monofilament line hanging down from bridge 36, the two lengths being opposite ends of a single piece of monofilament looped through closely spaced holes 37 through bridge 36. Similarly, any number of loops through any number of holes at any number of locations along bridge 36 may be used, thus resulting in a plurality of lengths of line comprising gate 34. Such a plurality of individual strands could also be considered a plurality of individual gates rather than components of a single gate. A gate consisting of two strands from a single loop is adequate, however, and offers ease of replacement if necessary.

In addition to the embodiments described above, the gate or gates of the present invention may be used in any number of applications within any type of fluid system transporting any type of article. Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

what is claimed:

1. A semiconductor wafer handling system comprising:

a polisher having a wafer holder;

a fluid nozzle connected to said polisher, said nozzle adapted to direct a fluid jet at a wafer to remove the wafer from said wafer holder after said polisher finishes polishing said wafer;

a fluid transport system having a first portion for transporting said wafer away from said polisher in a path and a second portion;

an unload cassette in the second portion of the fluid transport system for receiving said wafer leaving said first portion of the fluid transport system; and a flexible gate located between said first portion and said second portion of said fluid transport system, said gate having a first end and a second end, wherein the first end is fixed and the second end is disposed in the path of wafer transport without disrupting fluid flow, and said gate is adapted to allow said wafer to pass from said first portion of the fluid transport system into said second portion of the fluid transport system and also adapted to prevent said wafer from returning to said first portion after having passed into said second portion.

2. The wafer handling system according to claim 1 having a plurality of said gates.

3. The wafer handling system according to claim 1 wherein said gate comprises a material selected from the group consisting of monofilament line, rubber tubing, synthetic elastomer tubing, plastic tubing, and polymer tubing.

4. The wafer handling system according to claim 3 wherein said gate comprises monofilament line having a diameter of approximately 0.05 mm.

5. The wafer handling system according to claim 1 wherein the fluid transport system defines a horizontal direction, and wherein said gate first end is fixed above said fluid transport system and said second end hangs down in a vertical direction substantially perpendicular to said horizontal direction.

6. The wafer handling system according to claim 5 further comprising a bridge above said fluid transport system to which the gate first end is affixed.

7. The wafer handling system according to claim 6 wherein the gate comprises a plurality of elements affixed to said bridge.

8. The wafer handling system according to claim 6 wherein the gate comprises a single element affixed to said bridge.

9. The wafer handling system according to claim 6 wherein said bridge has at least one hole and said gate is affixed to said bridge through said at least one hole in said bridge.

10. The wafer handling system according to claim 9 wherein said bridge has a top surface and at least two holes and said gate comprises a single length of monofilament line having a middle and opposite ends, the line being fixed to said bridge with said middle resting on said top surface of said bridge and said ends protruding through said holes in said bridge and hanging down into said fluid transport system.

11. The wafer handling system according to claim 1 wherein the fluid comprises water.

12. The wafer handling system according to claim 11 wherein the first portion of the fluid transport system comprises a water track and the second portion of the fluid transport system comprises an unload cassette.

13. A semiconductor wafer handling system comprising:

a polisher having a wafer holder;

a water nozzle connected to said polisher, said nozzle adapted to direct a water jet at a wafer to remove the wafer from said wafer holder after said polisher finishes polishing said wafer;

a water track defining a substantially horizontal direction for transporting said wafer away from said polisher in a path;

an unload cassette for receiving said wafer leaving said water track; and a gate comprising a plurality of lengths of monofilament line, said gate located between said water track and said unload cassette, each of said lengths having a first end fixed above said water track and a second end suspended vertically from said first end such that each length is disposed substantially perpendicular to said horizontal direction in the path of wafer transport without disrupting water flow, said gate adapted to allow said wafer to pass from said water track into said unload cassette and also adapted to prevent said wafer from returning to said water track after having passed into said unload cassette.

14. The wafer handling system according to claim 13 further comprising a bridge disposed above said fluid transport system, said bridge having a top surface and at least one pair of holes, at least two of said lengths of monofilament line comprising opposite end portions of a single piece of monofilament line having a middle portion between said lengths, the line being fixed to said bridge with said middle portion resting on said top surface of said bridge and said lengths protruding through the pair of holes and hanging down into the fluid transport system.

* * * * *